United States Patent

Jiang

[11] Patent Number: 6,099,576
[45] Date of Patent: Aug. 8, 2000

[54] SYSTEM FOR DESIGNING AND MANUFACTURING CMOS INVERTERS BY ESTIMATING GATE RC DELAY

[75] Inventor: Chun Jiang, San Jose, Calif.

[73] Assignee: Advanced Micro Devices, Inc., Sunnyvale, Calif.

[21] Appl. No.: 09/033,276

[22] Filed: Mar. 2, 1998

[51] Int. Cl.[7] ..................................................... G06F 17/50
[52] U.S. Cl. .................................. 716/1; 716/2; 326/104; 326/108; 326/121
[58] Field of Search ....................... 395/500.03, 500.02; 716/1, 2; 326/104, 108, 121

[56] References Cited

PUBLICATIONS

Takagi et al "A Novel 0.15 uM CMOS Technolgy Using W/WNx/Polysilicon Gate Electrode And Ti Silicided Source/Drain Diffusions," IEEE, pp. 17.6.1–17.6.4, 1996.

Taur et al "CMOS Devices Below 0.1 uM: How High Will Performance Go? " IEEE, pp. 9.1.1–9.1.4, Dec. 1997.

Lai et al "Design And Implementation Of Differential Cascode Voltage Switch With Pass–Gate (DCVSPG) Logic For High–Performance Digital Systems," IEEE, pp. 563–573, Apr. 1997.

*Primary Examiner*—Paul R. Lintz
*Assistant Examiner*—Vuthe Siek
*Attorney, Agent, or Firm*—Renner Otto Boisselle & Sklar LLP

[57] ABSTRACT

A system for simplifying and expediting estimation of the gate RC delay and/or the determination of transistor widths for a given gate RC delay in a CMOS inverter circuit. The system determines gate RC delay as a function of transistor width. Alternatively, appropriate transistor widths may be determined based on a desired optimum gate RC delay. An analytical expression is established to predict RC induced gate propagation delay as a function of readily available technical parameters in the early stage of design. The analytical expression has been found to describe gate RC delay in CMOS inverter circuits incorporating 0.25 micron (or even smaller) manufacturing technology.

23 Claims, 5 Drawing Sheets

SYSTEM FOR DESIGNING AND MANUFACTURING CMOS INVERTERS BY ESTIMATING GATE RC DELAY

TECHNICAL FIELD

The present invention relates generally to the design and fabrication of complementary metal-oxide semiconductor (CMOS) circuits, and more particularly to CMOS inverter circuits.

BACKGROUND OF THE INVENTION

CMOS technology is well known in the art. CMOS technology has become the dominant technology for information processing because of its low operating voltage, low power consumption, and short channel length with accompanying high speed. Usually, other metal-oxide field effect transistor (MOSFET) technologies utilize only n-channel depletion-type or enhancement-type transistors summarized by the name NMOSFET, or PMOSFET technology which employs transistors with p-channels. However, CMOS technology is complementary because both n-channel and p-channel transistors are integrated on one chip.

Figure 1:
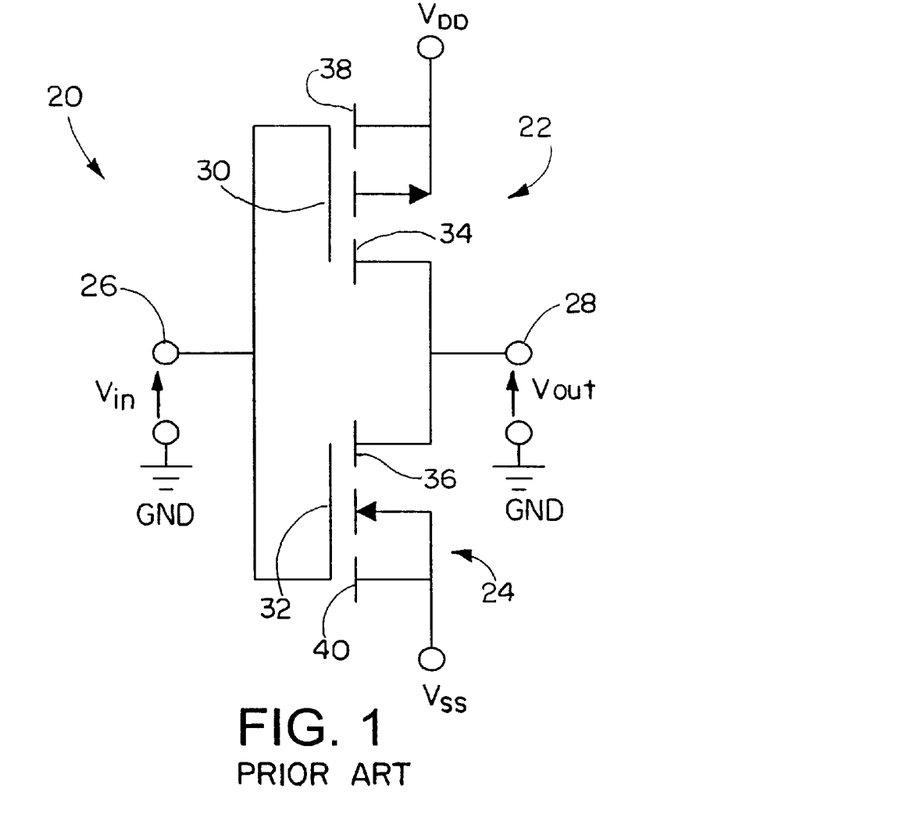
FIG. 1 is a schematic diagram of a conventional CMOS inverter circuit.

A CMOS inverter circuit serves as a fundamental building block in CMOS circuits. The CMOS inverter represents a low-power alternative to the depletion load inverter circuit. FIG. 1 represents schematically a typical CMOS inverter 20. The inverter 20 includes both a p-channel enhancement transistor 22 and an n-channel enhancement transistor 24. As shown, the inverter 20 is generally symmetric with respect to the inverter input terminal 26 and output terminal 28. The gates 30 and 32 of the p-channel transistor 22 and n-channel transistor 24, respectively, are connected together and serve as the input terminal 26. An input voltage $V_{in}$ is coupled to the input terminal 26 relative to ground.

Figure 2:
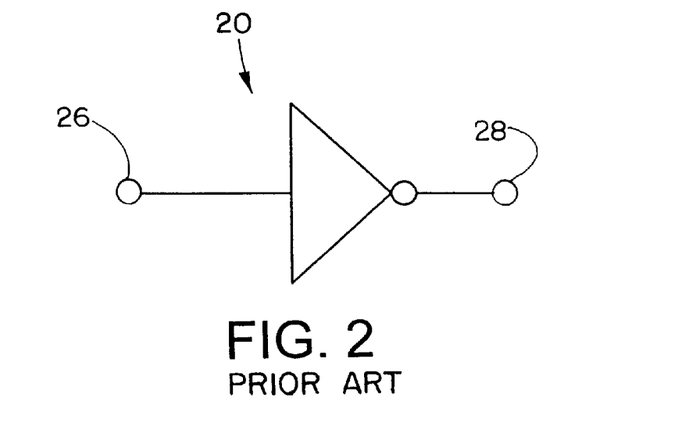
FIG. 2 is a logic symbol used to represent a conventional CMOS inverter circuit.

The drain regions 34 and 36 of the p-channel transistor 22 and n-channel transistor 24, respectively, are connected together and serve as the output terminal 28. An output voltage $V_{out}$ is presented at the output terminal 28 with respect to ground. The source region 38 of the p-channel transistor 22 is connected to a positive voltage $V_{DD}$. On the other hand, a more negative voltage $V_{SS}$ or ground is connected to the source region 40 of the n-channel transistor 24. A typical logic symbol representing the inverter 20 is illustrated in FIG. 2.

As is well known, when a logic "1" signal (e.g., 5 volts) is input to the input terminal 26, the inverter 20 will output a logic "0" signal (e.g., 0 volts) at the output terminal 28. Conversely, if a logic "0" is input the inverter 20 will output a logic "1".

In CMOS, as with most other technologies, the trend is to design circuits capable of operating at higher speeds. In addition, the trend is to design circuits with reduced line widths so as to increase the density/reduce the size thereof. As CMOS inverters are designed to operate at higher speeds and with reduced line widths, the gate RC delay of the inverter begins to play a larger role with respect to the performance of the inverter as well as any associated circuitry. The gate RC delay relates generally to the resistance of the gates of the respective p-channel and n-channel transistors making up the inverter. In addition, there exists intrinsic gate capacitance of the transistors which combines with the gate resistance to result in the gate RC delay.

Previously, the gate resistance and capacitance induced propagation delay for a CMOS inverter (herein referred to as the "gate RC delay") has been difficult to determine analytically. Many design applications such as the commonly known and commercially available SPICE simulation software rely on a mature model of the device requiring a large number of design parameters. Such a mature model of an inverter typically is not available during the early stages of circuit development. This makes it more difficult for designers to design and fabricate a complete CMOS circuit incorporating one or more inverters which will perform satisfactorily at a particular operating frequency and/or design width.

In view of the aforementioned shortcomings associated with previous approaches to designing and manufacturing CMOS inverters, there is a strong need in the art for a system which estimates a gate RC delay or related parameter as a function of technical parameters readily available in the early stages of design. For example, there is a need for a system which estimates a gate RC delay of a CMOS inverter without requiring a mature model. Similarly, there is a strong need for a system which determines a width of the n-channel and p-channel transistors in order to achieve a given gate RC delay.

SUMMARY OF THE INVENTION

The present invention relates to the identification of design parameters which simplify and expedite estimation of the gate RC delay and/or the determination of transistor widths for a given gate RC delay in a CMOS inverter circuit. The present invention allows designers to determine gate RC delay as a function of transistor width in a CMOS inverter circuit. Alternatively, appropriate transistor widths may be determined based on a desired optimum gate RC delay. An analytical expression is established to predict RC induced gate propagation delay as a function of readily available technical parameters in the early stage of design. The analytical expression has been found to describe gate RC delay in CMOS inverter circuits incorporating 0.25 micron (or even smaller) manufacturing technology.

According to one particular aspect of the invention, a system is provided for designing a CMOS inverter circuit comprising a p-channel transistor and an n-channel transistor each having a respective polysilicide gate and gate oxide layer. The system includes an input device for receiving as an input at least one parameter of the CMOS inverter circuit relating to a parameter selected from a group comprising $\tau_{rc}$, $\rho_{sn}$, $\rho_{sp}$, $\omega_n$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors; a computer, operatively coupled to the input device, programmed to estimate at least another of the parameters $\tau_{rc}$, $\rho_{sn}$, $\rho_{sp}$, $\omega_n$, $\omega_p$, and $C_{ox}$ based on the at least one parameter input to the input device using the following relationship, $$\tau_{rc} = k \sim ((\rho_{sn} \cdot \omega_n^2) + (\rho_{sp} \cdot \omega_p^2)) \cdot C_{ox}$$

where k represents a predefined constant; and further including an output which provides indicia of the estimated at least another of the parameters, as determined by the computer.

According to another aspect of the invention, a computer program is provided for designing a CMOS inverter circuit comprising a p-channel transistor and an n-channel transistor each having a respective polysilicide gate and gate oxide layer. The computer program is encoded on a computer-readable medium which when read and executed by a computer, causes the computer to: receive as an input at least one parameter of the CMOS inverter circuit relating to a parameter selected from a group comprising $\tau_{rc}$, $\rho_{sn}$, $\rho_{sp}$, $\omega_n$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors; estimate at least another of the parameters $\tau_{rc}$, $\rho_{sn}$, $\rho_{sp}$, $\omega_n$, $\omega_p$, and $C_{ox}$ based on the at least one parameter input to the input device using the following relationship, $$\tau_{rc} = k \cdot ((\rho_{sn} \cdot \omega_n^2) + (\rho_{sp} \cdot \omega_p^2)) \cdot C_{ox}$$

where k represents a predefined constant; and output indicia of the estimated at least another of the parameters, as determined by the computer.

In accordance with yet another aspect of the invention, a method is provided for designing a CMOS inverter circuit comprising a p-channel transistor and an n-channel transistor each having a respective polysilicide gate and gate oxide layer. The method includes the steps of: receiving as an input at least one parameter of the CMOS inverter circuit relating to a parameter selected from a group comprising $\tau_{rc}$, $\rho_{sn}$, $\rho_{sp}$, $\omega_p$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors; estimating at least another of the parameters $\tau_{rc}$, $\rho_{sn}$, $\rho_{sp}$, $\omega_n$, $\omega_p$, and $C_{ox}$ based on the at least one parameter received as an input using the following relationship, $$\tau_{rc} = k \cdot ((\rho_{sn} \cdot \omega_n^2) + (\rho_{sp} \cdot \omega_p^2)) \cdot C_{ox}$$

where k represents a predefined constant; and providing indicia of the estimated at least another of the parameters.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

The present invention will now be described in connection with the drawings, in which like reference numerals are used to refer to like elements throughout.

Figure 3:
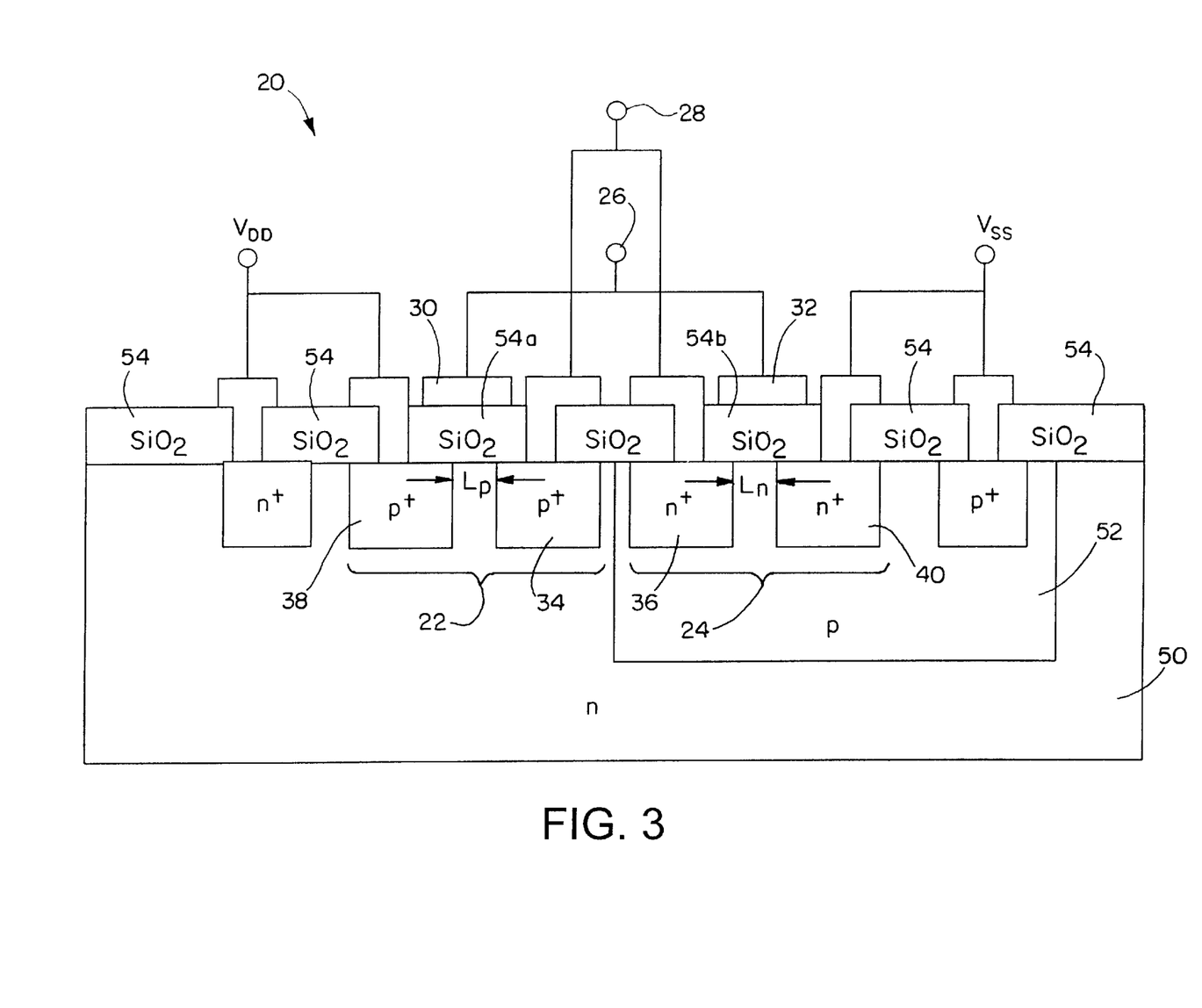
FIG. 3 is a cross-section view of a CMOS inverter circuit designed in accordance with the present invention.

Referring initially to FIG. 3, a CMOS inverter circuit 20 designed and manufactured in accordance with the present invention is shown in cross-section. In the exemplary embodiment, the inverter 20 in FIG. 3 has the same topology as that shown in FIG. 1 and hence like reference numerals are used to refer to the same elements. The inverter 20 is manufactured using known 0.25 micron technology.

The inverter 20 is formed on an n-type substrate 50 which includes an p-type isolation region 52 as shown. The p-channel transistor 22 includes p$^+$ source and drain regions 38 and 34, respectively, formed in the substrate 50. A gate oxide layer 54a is formed on the surface of the substrate 50 between the source region 38 and the drain region 34. The gate oxide layer 54a preferably is made of SiO$_2$, for example, and has formed thereon a polysilicide gate 30. The polysilicide gate 30 is made up of a polysilicon layer formed atop the gate oxide layer 54a, with a silicide layer formed on top of the polysilicon layer as is conventional. As is known, the silicide layer is used to reduce the resistance of the polysilicon. The distance L$_p$ between the source region 38 and the drain region 34 defines the channel length of the p-channel transistor 22. The width of the p-channel in the p-channel transistor 22 is represented by $\omega_p$ (not shown) and, as is known, is defined by the width of the gate 30 and oxide layer 54a in a direction perpendicular to the plane of the page in FIG. 3.

The n-channel transistor 24 includes n$^+$ source and drain regions 40 and 46, respectively, formed in the isolation region 52. A gate oxide layer 54b is formed on the surface of the substrate 50 between the source region 40 and the drain region 36. The gate oxide layer 54b preferably is also made of SiO$_2$, for example, and has formed thereon a polysilicide gate 32. In the case of the n-channel transistor 24, the distance L$_n$ between the source region 40 and the drain region 36 defines the channel length of the transistor. The n-channel width for the n-channel transistor 24 is represented by $\omega_n$ (not shown) and, as is known, is defined by the width of the gate 32 and oxide layer 54b in a direction perpendicular to the plane of the page in FIG. 3.

As will be appreciated, the gate oxide layers 54a and 54b will typically be formed as part of the same manufacturing process whereby a gate oxide layer 54 is initially formed on the surface of the substrate 50. The gate oxide layer 54 is then patterned and etched using appropriate masks and known lithographic techniques to form, among other things, the gate oxide layers 54a and 54b for the p-channel and n-channel transistors 22 and 24, respectively.

The material used for the gate oxide layer 54 (e.g., SiO$_2$) will have a known capacitance per unit area, represented by $C_{ox}$. Since the gate oxide layers 54a and 54b are typically formed as part of the same process steps, they will have approximately the same thickness.

The polysilicide gates 30 and 32 will also typically be formed as part of the same process steps. For example, a polysilicide layer to be used for various gates and local interconnects is formed atop the gate oxide layer 54. The polysilicide layer 54 is then patterned and etched using appropriate masks and conventional lithographic techniques to form the gates 30 and 32 along with the various other connections between the transistors 22 and 24. In another embodiment, however, the polysilicide gates 30 and 32 may be made using different polysilicon layers (e.g., as part of a poly I etch and poly II etch). In either case, the polysilicide material used to form the gates 30 and 32 will have a known sheet resistance represented by $\rho_{sp}$ and $\rho_{sn}$, respectively.

FIG. 3 illustrates the completed CMOS inverter 20. As mentioned above, however, oftentimes in designing the CMOS inverter it is desirable to know the gate RC delay of the inverter 20 prior to arriving at a mature model with all of the dimensions of the CMOS inverter decided upon. Alternatively, for example, it is desirable to determine acceptable channel widths of the p-transistor 22 and the n-transistor 24 based on a predefined acceptable gate RC delay, and prior to designing the complete inverter 20 with respect to all relevant dimensions.

The present invention relates to the identification of design parameters which simplify and expedite estimation of the gate RC delay and/or the determination of transistor widths for a given gate RC delay. For example, the present invention allows designers to determine gate RC delay as a function of transistor width in the CMOS inverter 20. Alternatively, appropriate transistor widths may be determined based on a desired optimum gate RC delay.

According to the present invention, the following analytical expression is established to predict RC induced gate propagation delay as a function of readily available technical parameters in the early stage of design. The analytical expression has been found to describe gate RC delay in CMOS inverter circuits incorporating 0.25 micron (or even smaller) manufacturing technology. The expression is represented by:

$$\tau_{rc} = k \cdot ((\rho_{sn} \cdot \omega_n^2) + (\rho_{sp} \cdot \omega_p^2)) \cdot C_{ox}$$

where τrc represents the gate RC delay, $\rho_{sn}$ represents the sheet resistance of the polysilicide gate of the n-channel transistor 24, $\rho_{sp}$ represents the sheet resistance of the polysilicide gate of the p-channel transistor 22, $\omega_n$ represents a channel width of the n-channel transistor 24, $\omega_p$ represents a channel width of the p-channel transistor 22, $C_{ox}$ represents the capacitance per unit area of the gate oxide layers of the p-channel and n-channel transistors 22 and 24, and k represents a predefined constant.

The gate RC delay $\tau_{rc}$ is represented in units of seconds, for example. The sheet resistances $\rho_{sn}$ and $\rho_{sp}$ are represented, for example, in units of ohms per square. The channel widths $\omega_n$ and $\omega_p$ are represented in units of meters, for example. Finally, the capacitance per unit area $C_{ox}$ is represented in units of farads per meter$^2$. The constant "k" for use in 0.25 micron technology has been determined empirically to be approximately 0.13, although it will be appreciated that other values may be more appropriate in different technologies.

As will be discussed in more detail below in relation to FIG. 7, the expression set forth in Equ. 1 has been confirmed by experimental measurement for an inverter 20 manufactured using 0.25 micron technology. By providing simply the parameters $\rho_{sn}$, $\rho_{sp}$, $\omega_n$, $\omega_p$, and $C_{ox}$, the gate RC delay may be estimated. Alternatively, for a desired gate RC delay and known values of $\rho_{sn}$, $\rho_{sp}$, and $C_{ox}$, the relative channel widths $\omega_n$ and $\omega_p$ may be ascertained for providing the desired gate RC delay.

Figure 4:
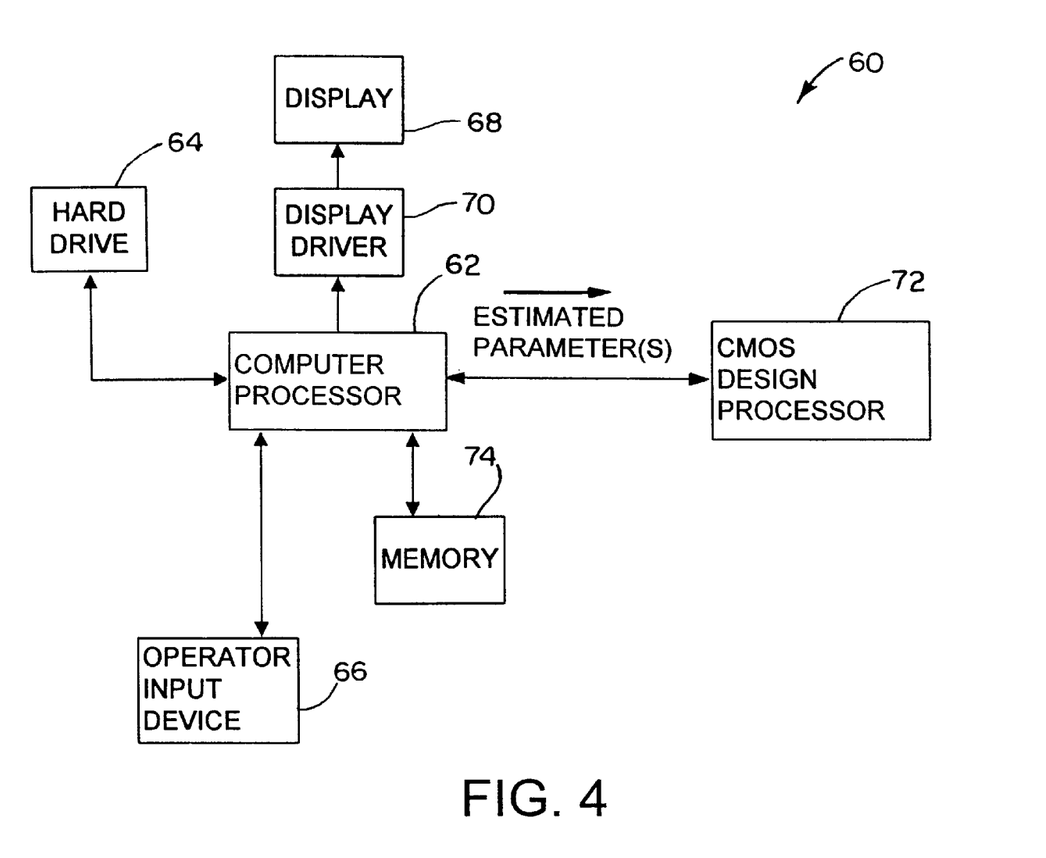
FIG. 4 is a block diagram of a computer based system for designing or designing and manufacturing a CMOS inverter circuit in accordance with the present invention.

FIG. 4 is a block diagram of a computer system 60 for designing and manufacturing the CMOS inverter 20 in accordance with the present invention. The system 60 includes a computer processor 62 which is programmed to evaluate the gate RC delay of the CMOS inverter 20 in accordance with the expression set forth in Equ. 1. Preferably such evaluation is carried out in the early stages of design prior to the investment of significant resources in a design which may subsequently be scrapped as a result of unacceptable gate RC delay characteristics. Nevertheless, the evaluation based on the expression of Equ. 1 may be carried out even subsequent to manufacturing without necessarily departing from the scope of the invention.

Figure 5:
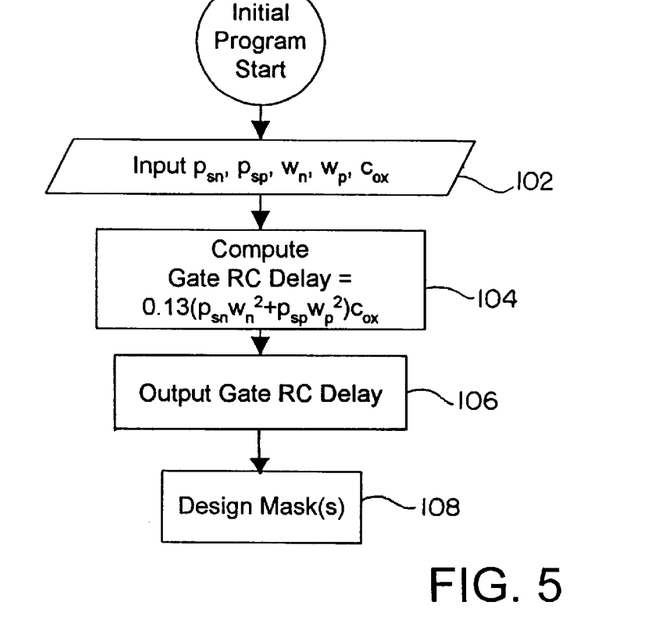
FIG. 5 is a flowchart representing code executable by the computer in the system of FIG. 4 to estimate gate RC delay for a CMOS inverter circuit in accordance with the present invention.
Figure 6:
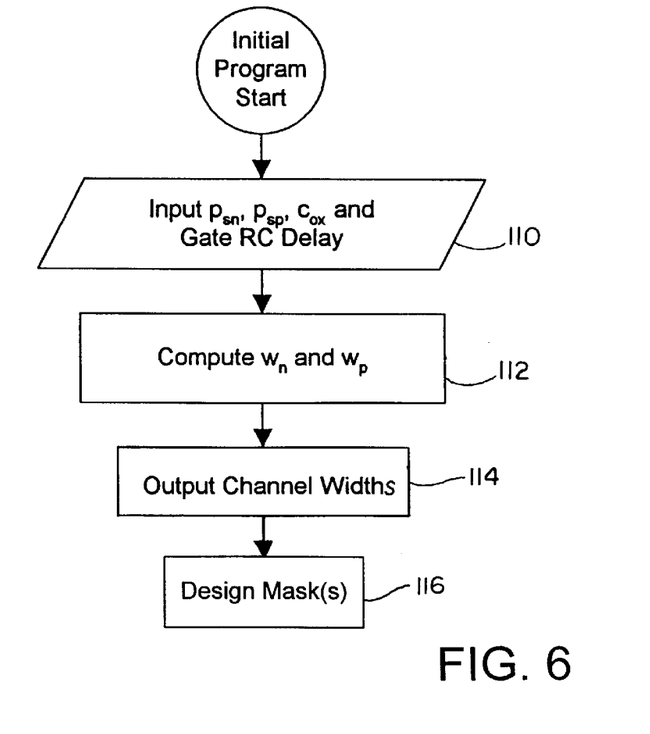
FIG. 6 is a flowchart representing code executable by the computer in the system of FIG. 4 to estimate the width of the p-channel and n-channel resistor for a given gate RC delay in a CMOS inverter circuit in accordance with the present invention.

The system 60 further includes a hard drive 64 or other non-volatile storage medium (e.g., a floppy disk and drive) for storing computer code executable by the computer processor 62 in carrying out the operations described herein. More specifically, the hard drive 64 has stored therein machine readable code which is accessed and executed by the computer processor 62 in order to cause the computer processor 62 to evaluate the expression of Equ. 1 based on parameters which are input or otherwise defined. FIGS. 5 and 6, discussed in more detail below, represent flowcharts representing the program stored in the hard drive 64 which is executed by the computer processor 62. It will be readily apparent to a person having ordinary skill in the art of computer programming how to write and use the particular code stored on the hard drive 64 or other non-volatile storage medium for carrying out the operations described herein based on the present description. Any of a variety of different programming languages may be utilized, including but not limited to C++, Basic, Fortran, Assembler, etc. Hence, details as to the actual code itself have been omitted for sake of brevity.

The system 60 also includes an operator input device 66 such as a keyboard, touch panel display, etc., coupled to the computer processor 62. The input device 66 permits an operator to input data corresponding to, for example, one or more of the above-discussed parameters $\tau_{rc}$, $\rho_{sn}$, $\rho_{sp}$, $\omega_n$, $\omega_p$, and $C_{ox}$ for a given CMOS inverter 20. Such parameters are provided from the device 66 to the computer processor 62 for subsequent evaluation in accordance with the expression of Equ. 1. In addition or in the alternative, the input device 66 may include a floppy disk and disk drive, bus interface, or other data medium, from which the computer processor 62 can access one or more of the parameters $\tau_{rc}$, $\rho_{sn}$, $\rho_{sp}$, $\omega_n$, $\omega_p$, and $C_{ox}$.

A display 68 serves as visual output in the system 60 to display the results of the evaluation in accordance with the invention. The display 68 is coupled to the computer processor 62 via a display driver 70 as is conventional. If, for example, the parameters $\rho_{sn}$, $\rho_{sp}$, $\omega_n$, $\omega_p$, and $C_{ox}$ are input to the processor 62 via the input device 66, the computer processor 62 estimates the gate RC delay by plugging in the values of the parameters $\rho_{sn}$, $\rho_{sp}$, $\omega_n$, $\omega_p$, and $C_{ox}$ into Equ. 1 and estimating the gate RC delay $\tau_{rc}$ based thereon. The computer processor 62 then causes the estimated value of $\tau_{rc}$ to be displayed to the operator via the display 78. The display 78 may be virtually any type of display such as a cathode ray tube (CRT) display, a liquid crystal display (LCD), etc.

In the exemplary embodiment, the system 60 also includes a CMOS design processor 72 for carrying out conventional CMOS inverter design processes based on the estimates provided via Equ. 1 and the processor 62. For example, provided the processor 62 estimates a gate RC delay which is acceptable, the processor 62 notifies the processor 72 to proceed with designing the CMOS inverter 20 in accordance with the parameters previously input via the device 66. This may include the steps of designing appropriate masks to be used in the formation of the gate oxide layers 54a, 54b and the polysilicide gates 30 and 32 as discussed above.

Alternatively, if the computer processor 62 determines the channel widths $\omega_n$, $\omega_p$ of the n-channel and p-channel transistors using the expression of Equ. 1 based on a desired gate RC delay and parameters $\rho_{sn}$, $\rho_{sp}$ and $C_{ox}$ which are input via the device 66, such channel widths are provided to the design processor 72. The design processor 72 then develops design data for manufacturing masks for the CMOS inverter 20 based on estimated channel widths for obtaining the desired gate RC delay. The estimated channel widths are used to define the widths of the areas on the masks used to define the gate oxide layers and polysilicide gates as is otherwise conventional. It will be appreciated that the computer processor 62 and the CMOS design processor 72 may in fact be the very same processor running applications for both functions.

The system 60 finally includes a memory 74 used for temporary storage in carrying out the various functions described herein. For example, the memory 74 may comprise random-access-memory (RAM) which the computer processor 62 utilizes in carrying out the operations described herein.

EXAMPLE 1

FIG. 5 illustrates the sequence of steps carried out by the system 60 in estimating the gate RC delay in accordance with the present invention. In step 102, the computer processor 62 prompts an operator to input the values of the parameters $\rho_{sn}$, $\rho_{sp}$, $\omega_n$, $\omega_p$, and $C_{ox}$ for the CMOS inverter 20 of interest. Such prompting may be via a visual display presented on the display 68. Consequently, in step 102 the operator inputs the parameters $\rho_{sn}$, $\rho_{sp}$, $\omega_n$, $\omega_p$, and $C_{ox}$ into the system via the input device 66. Next, in step 104 the computer processor 62 computes the value of $\tau_{rc}$ based on the input parameters $\rho_{sn}$, $\rho_{sp}$, $\omega_n$, $\omega_p$, and $C_{ox}$. More specifically, the computer processor 62 plugs the values of the input parameters $\rho_{sn}$, $\rho_{sp}$, $\omega_n$, $\omega_p$, and $C_{ox}$ into Equ. 1 and determines the resultant value of $\tau_{rc}$.

The computer processor 62 in step 106 then outputs the value of $\tau_{rc}$ via the display 68, for example. If the value of $\tau_{rc}$ is acceptable to the operator, the operator may be prompted via the display 68 to enter an "accept" command via the input device 66. In such case, the computer processor 62 proceeds to step 108 in which it forwards the input parameters $\omega_n$ and $\omega_p$ to the design processor 72 whereby appropriate masks are designed using such input parameters.

EXAMPLE 2

FIG. 6 represents the sequence of steps in accordance with another example of the invention. In this example, the computer processor 62 in step 110 prompts the operator via the display 68 to input parameters representing the desired $\tau_{rc}$ and the known values of $\rho_{sn}$, $\rho_{sp}$ and $C_{ox}$. Next, in step 112 the computer processor 62 solves Equ. 1 for the channel widths $\omega_n$, $\omega_p$ based on the input parameters. In this example, the computer processor 62 may solve Equ. 1 for the relative channel widths, i.e., the ratio of $\omega_n$ to $\omega_p$. Thus, in step 112 the computer processor 62 may further prompt the operator via the display 68 to input a desired value for either channel width $\omega_n$ or $\omega_p$ by way of the input device 66. The processor 62 can then compute the estimated value for the other of channel widths $\omega_n$ and $\omega_p$ in step 112.

Next, in step 114 the computer processor 62 outputs the values of the channel widths $\omega_n$ and $\omega_p$ via the display 68, for example. In addition, or in the alternative, the computer processor 62 outputs the values of $\omega_n$ and $\omega_p$ to the design processor 72. The design processor 72 in turn produces design data relating to the CMOS inverter 20 based on the values of $\omega_n$ and $\omega_p$. For example, the processor 72 in step 116 generates the appropriate masks for forming the gate oxide layers and polysilicide gates using the values of $\omega_n$ and $\omega_p$ as is conventional.

Figure 7:
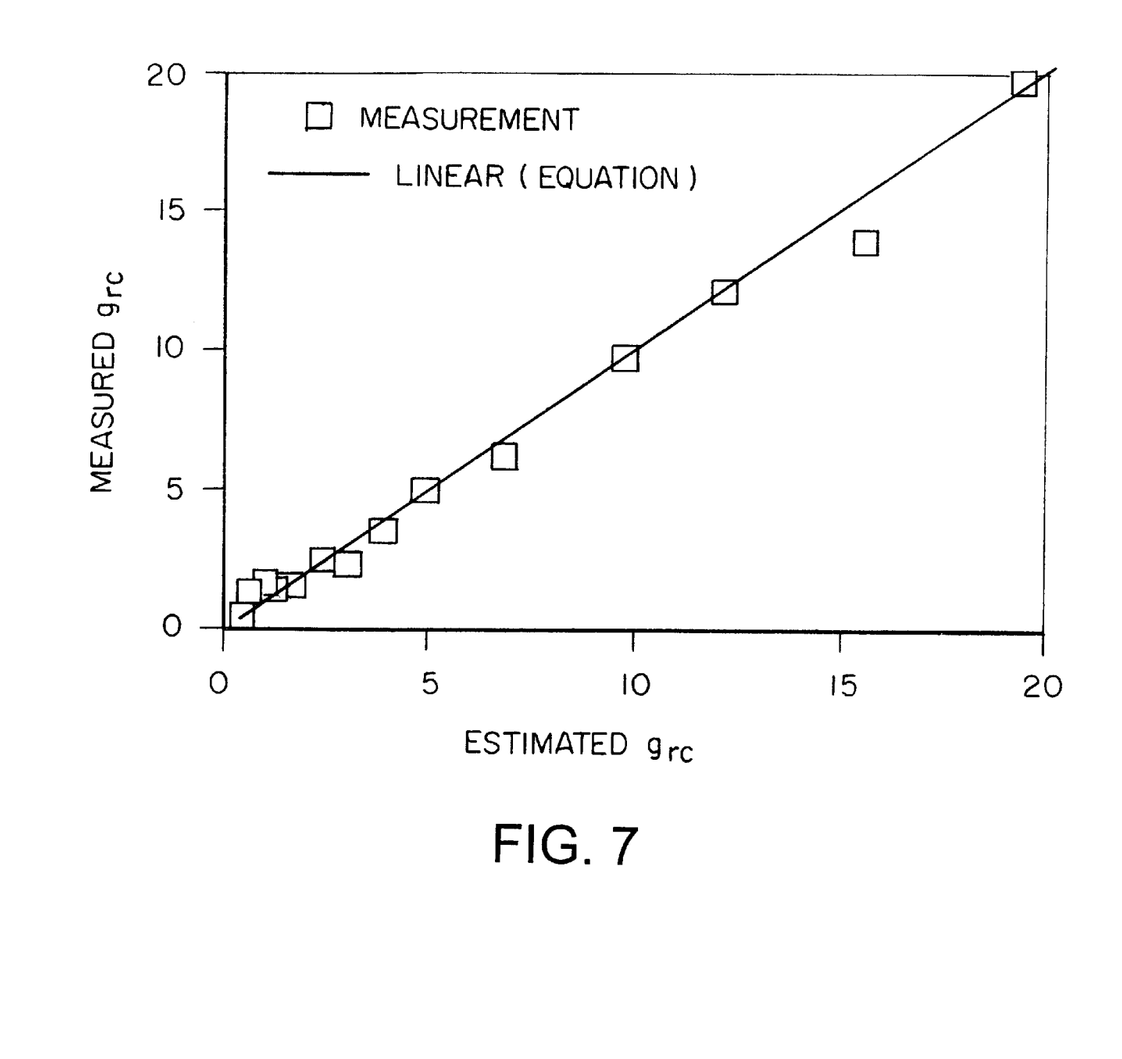
FIG. 7 is a plot showing a comparison of estimated gate RC delay versus measured gate RC delay in accordance with the present invention.

FIG. 7 represents graphically the measured gate RC delay of a CMOS inverter as compared to the estimated gate RC delay in accordance with the present invention. As shown in FIG. 7, the measured gate RC delay (shown by □'s) is very close to the estimated gate RC delay (shown via a straight line). Accordingly, designers may rely on the estimates produced in accordance with the present invention as being indicative of the performance of the actual CMOS inverter.

Although the invention has been shown and described with respect to certain preferred embodiments, it is obvious that equivalents and modifications will occur to others skilled in the art upon the reading and understanding of the specification. For example, the exemplary embodiment has been described in relation to an enhancement type CMOS inverter. However, the invention is also suitable for other CMOS inverters including, for example, depletion type transistors.

In addition, the above examples are described in the context of an operator inputting all of the parameters with the exception of those being estimated. However, it will be appreciated that some of the parameters may be stored in the computer system and taken as being fixed. Generally speaking, the invention has utility in any case where it is desirable to evaluate the effect of one or more parameters based on one or more other parameters in accordance with the expression of Equ. 1.

The present invention includes all such equivalents and modifications, and is limited only by the scope of the following claims.

What is claimed is:

1. A system for designing a CMOS inverter circuit comprising a p-channel transistor and an n-channel transistor each having a respective polysilicide gate and gate oxide layer, comprising:

an input device for receiving as an input at least one parameter of the CMOS inverter circuit relating to a parameter selected from a group comprising $\tau_{rc}$, $\rho_{sn}$, $\rho_{sp}$, $\omega_n$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors;

a computer, operatively coupled to the input device, programmed to estimate at least another of the parameters $\tau_{rc}$, $\rho_{sn}$, $\rho_{sp}$, $\omega_n$, $\omega_p$, and $C_{ox}$ based on the at least one parameter input to the input device using the following relationship, $$\tau_{rc}=k\cdot((\rho_{sn}\cdot\omega_n^2)+(\rho_{sp}\cdot\omega_p^2))\cdot C_{ox}$$

where k represents a predefined constant; and an output which provides indicia of the estimated at least another of the parameters, as determined by the computer.

2. The system of claim 1, wherein the at least one parameter input to the input device comprises the parameters $\rho_{sn}$, $\rho_{sp}$, $\omega_n$, $\omega_p$, and $C_{ox}$, and the estimated at least another of the parameters comprises $\tau_{rc}$.

3. The system of claim 1, wherein the at least one parameter input to the input device comprises the parameters $\tau_{rc}$, $\rho_{sn}$, $\rho_{sp}$, and $C_{ox}$, and the estimated at least another of the parameters comprises $\omega_n$ and $\omega_p$.

4. The system of claim 1, wherein the input device comprises at least one of a keypad and a machine readable medium comprising computer code executed by the computer, the computer code having the at least one parameter included therein.

5. The system of claim 1, wherein the computer comprises a CMOS design processor which produces design data representing physical parameters for constructing the CMOS inverter circuit based on the estimated at least another of the parameters.

6. The system of claim 5, wherein the design data represents at least one mask for fabricating the CMOS inverter circuit.

7. The system of claim 6, wherein the at least one mask is premised on 0.25 micron CMOS technology or smaller.

8. The system of claim 1, wherein k is approximately equal to 0.13.

9. A computer program for designing a CMOS inverter circuit comprising a p-channel transistor and an n-channel transistor each having a respective polysilicide gate and gate oxide layer, the computer program being encoded on a computer-readable medium which when read and executed by a computer, causes the computer to:

receive as an input at least one parameter of the CMOS inverter circuit relating to a parameter selected from a group comprising $\tau_{rc}$, $\rho_{sn}$, $\rho_{sp}$, $\omega_n$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors;

estimate at least another of the parameters $\tau_{rc}$, $\rho_{sn}$, $\rho_{sp}$, $\omega_n$, $\omega_p$, and $C_{ox}$ based on the at least one parameter input to the input device using the following relationship, $$\tau_{rc}=k\cdot((\rho_{sn}\cdot\omega_n^2)+(\rho_{sp}\cdot\omega_p^2))\cdot C_{ox}$$

where k represents a predefined constant; and output indicia of the estimated at least another of the parameters, as determined by the computer.

10. The program of claim 9, wherein the at least one parameter input to the computer comprises the parameters $\rho_{sn}$, $\rho_{sp}$, $\omega_n$, $\omega_p$, and $C_{ox}$, and the estimated at least another of the parameters comprises $\tau_{rc}$.

11. The program of claim 9, wherein the at least one parameter input to the computer comprises the parameters $\tau_{rc}$, $\rho_{sn}$, $\rho_{sp}$, and $C_{ox}$, and the estimated at least another of the parameters comprises $\omega_n$ and $\omega_p$.

12. The program of claim 9, wherein the computer comprises a CMOS design processor which produces design data representing physical parameters for constructing the CMOS inverter circuit based on the estimated at least another of the parameters.

13. The program of claim 12, wherein the design data represents at least one mask for fabricating the CMOS inverter circuit.

14. The program of claim 13, wherein the at least one mask is premised on 0.25 micron CMOS technology or smaller.

15. The program of claim 9, wherein k is approximately equal to 0.13.

16. A method for designing a CMOS inverter circuit comprising a p-channel transistor and an n-channel transistor each having a respective polysilicide gate and gate oxide layer, comprising the steps of:

receiving as an input at least one parameter of the CMOS inverter circuit relating to a parameter selected from a group comprising $\tau_{rc}$, $\rho_{sn}$, $\rho_{sp}$, $\omega_n$, $\omega_p$, and $C_{ox}$, where $\tau_{rc}$ represents a gate RC delay, $\rho_{sn}$ represents a sheet resistance of the polysilicide gate of the n-channel transistor, $\rho_{sp}$ represents a sheet resistance of the polysilicide gate of the p-channel transistor, $\omega_n$ represents a channel width of the n-channel transistor, $\omega_p$ represents a channel width of the p-channel transistor, and $C_{ox}$ represents the capacitance per unit area of the gate oxide layers of the p-channel and n-channel transistors;

estimating at least another of the parameters $\tau_{rc}$, $\rho_{sn}$, $\rho_{sp}$, $\omega_n$, $\omega_p$, and $C_{ox}$ based on the at least one parameter received as an input using the following relationship, $$\tau_{rc}=k\cdot((\rho_{sn}\cdot\omega_n^2)+(\rho_{sp}\cdot\omega_p^2))\cdot C_{ox}$$

where k represents a predefined constant; and providing indicia of the estimated at least another of the parameters.

17. The method of claim 16, wherein the at least one parameter received as an input comprises the parameters $\rho_{sn}$, $\rho_{sp}$, $\omega_n$, $\omega_p$, and $C_{ox}$, and the estimated at least another of the parameters comprises $\tau_{rc}$.

18. The method of claim 16, wherein the at least one parameter received as an input comprises the parameters $\tau_{rc}$, $\rho_{sn}$, $\rho_{sp}$, and $C_{ox}$, and the estimated at least another of the parameters comprises $\omega_n$ and $\omega_p$.

19. The method of claim 16, wherein the input is received by way of at least one of a keypad and a machine readable medium comprising computer code executed by a computer, the computer code having the at least one parameter included therein.

20. The method of claim 16, further comprising the step of producing design data representing physical parameters for constructing the CMOS inverter circuit based on the estimated at least another of the parameters.

21. The method of claim 20, wherein the design data represents at least one mask for fabricating the CMOS inverter circuit.

22. The method of claim 21, wherein the at least one mask is premised on 0.25 micron CMOS technology or smaller.

23. The method of claim 16, wherein k is approximately equal to 0.13.

* * * * *